(12) United States Patent
Wessel et al.

(10) Patent No.: US 8,470,463 B2
(45) Date of Patent: Jun. 25, 2013

(54) MAGNETIC SHIELD WITH IN-PLANE ANISOTROPY

(75) Inventors: James Gary Wessel, Savage, MN (US); Bin Lu, San Ramon, CA (US); Werner Scholz, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 97 days.

(21) Appl. No.: 13/092,737

(22) Filed: Apr. 22, 2011

(65) Prior Publication Data

US 2012/0270072 A1 Oct. 25, 2012

(51) Int. Cl.
- *G11B 5/11* (2006.01)
- *G11B 17/32* (2006.01)
- *C22C 5/04* (2006.01)
- *B32B 15/00* (2006.01)

(52) U.S. Cl.
USPC ..... 428/812; 428/815; 428/692.1; 428/693.1; 360/235.4; 360/319

(58) Field of Classification Search
None
See application file for complete search history.

(56) References Cited

U.S. PATENT DOCUMENTS

| | | | |
|---|---|---|---|
| 5,187,628 A | 2/1993 | Kanai et al. | |
| 5,326,637 A | 7/1994 | Nasu et al. | |
| 6,156,422 A | 12/2000 | Wu et al. | |
| 6,771,567 B2 | 8/2004 | Nozieres et al. | |
| 6,939,626 B2 | 9/2005 | Tang | |
| 7,035,062 B1* | 4/2006 | Mao et al. | 360/324.2 |
| 8,238,059 B1* | 8/2012 | Tang et al. | 360/125.03 |
| 2002/0171982 A1* | 11/2002 | Lairson et al. | 360/319 |
| 2004/0105196 A1 | 6/2004 | Kataoka | |
| 2006/0198059 A1 | 9/2006 | Sakai et al. | |
| 2006/0199043 A1 | 9/2006 | Sugimoto et al. | |
| 2007/0002481 A1 | 1/2007 | Kikitsu et al. | |
| 2007/0139826 A1 | 6/2007 | Carey et al. | |
| 2010/0165510 A1* | 7/2010 | Takahashi et al. | 360/135 |
| 2010/0220415 A1* | 9/2010 | Yamada et al. | 360/319 |
| 2012/0063032 A1* | 3/2012 | Meloche et al. | 360/125.01 |
| 2013/0027812 A1* | 1/2013 | Scholz et al. | 360/235.4 |

* cited by examiner

*Primary Examiner* — Kevin Bernatz
(74) *Attorney, Agent, or Firm* — Hall Estill Attorneys at Law (57) ABSTRACT

An apparatus and associated method are generally directed to a magnetic shield capable of screening magnetic flux with in-plane anisotropy. Various embodiments of the present invention may have at least one magnetic shield. The shield may be constructed of a Cobalt-Iridium compound capable of providing in-plane anisotropy along a longitudinal plane of the shield.

20 Claims, 5 Drawing Sheets

MAGNETIC SHIELD WITH IN-PLANE ANISOTROPY

SUMMARY

Various embodiments of the present invention are generally directed to a magnetic shield capable of screening magnetic flux with in-plane anisotropy. In accordance with various embodiments, at least one magnetic shield is constructed of a Cobalt-Iridium compound capable of providing in-plane anisotropy along a longitudinal plane of the shield.

DETAILED DESCRIPTION

The present disclosure generally relates to magnetic shielding with materials having high in-plane anisotropy. Currently, a large segment of data storage and retrieval is being conducted through the use of data sensing elements that are sensitive to any encountered external magnetic field. Magnetic shields can be used to deflect unwanted external magnetic fields from reaching, and interfering, with the sensing of data. As areal resolution of magnetic data storage media has increased, industry has pursued reducing the size of magnetic shields while maintaining strict shielding characteristics.

Accordingly, a shield material that exhibits high in-plane anisotropy can shield unwanted external magnetic fields with a relatively small thickness. By orienting the in-plane anisotropy parallel to the longitudinal plane of the shield that runs perpendicular to an adjacent operating surface of a magnetic storage media, the magnetic stability of a magnetic sensing element can be enhanced. Such in-plane anisotropy can further enhance operational characteristics of the sensing element by improving readback performance through increased pulse amplitude and average pulse width (PW50).

Figure 1:
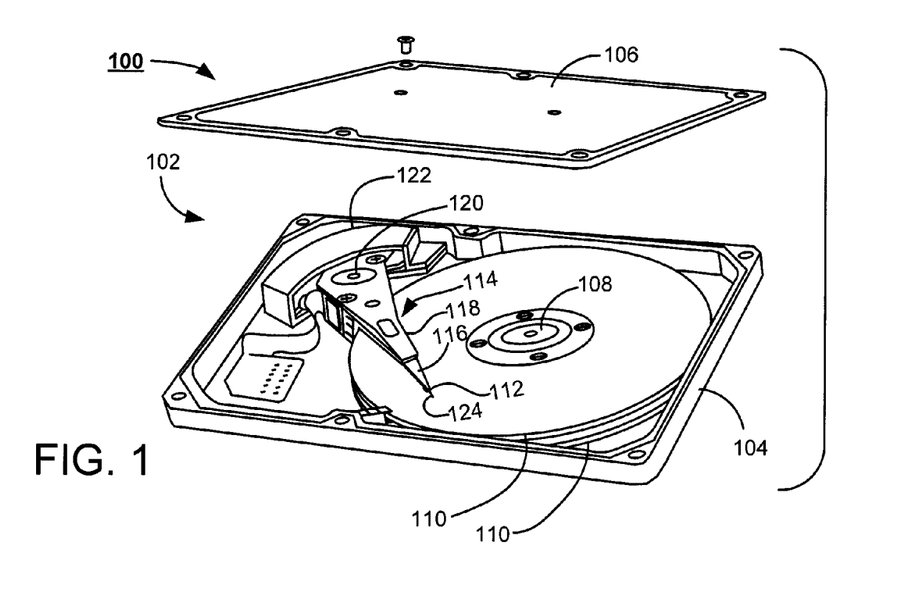
FIG. 1 is a perspective view of a data storage device in an embodiment.

An embodiment of a data storage device 100 is provided in FIG. 1. The device 100 shows a non-limiting environment in which various embodiments of the present invention can be practiced. The device 100 includes a substantially sealed housing 102 formed from a base deck 104 and top cover 106. An internally disposed spindle motor 108 is configured to rotate a number of magnetic storage media 110. The media 110 are accessed by a corresponding array of data transducers (read/write heads) that are each supported by a head gimbal assembly (HGA) 112.

Each HGA 112 can be supported by a head-stack assembly 114 ("actuator") that includes a flexible suspension 116, which in turn is supported by a rigid actuator arm 118. The actuator 114 may pivot about a cartridge bearing assembly 120 through application of current to a voice coil motor (VCM) 122. In this way, controlled operation of the VCM 122 causes the transducers (numerically denoted at 124) to align with tracks (not shown) defined on the media surfaces to store data thereto or retrieve data therefrom.

Figure 2:
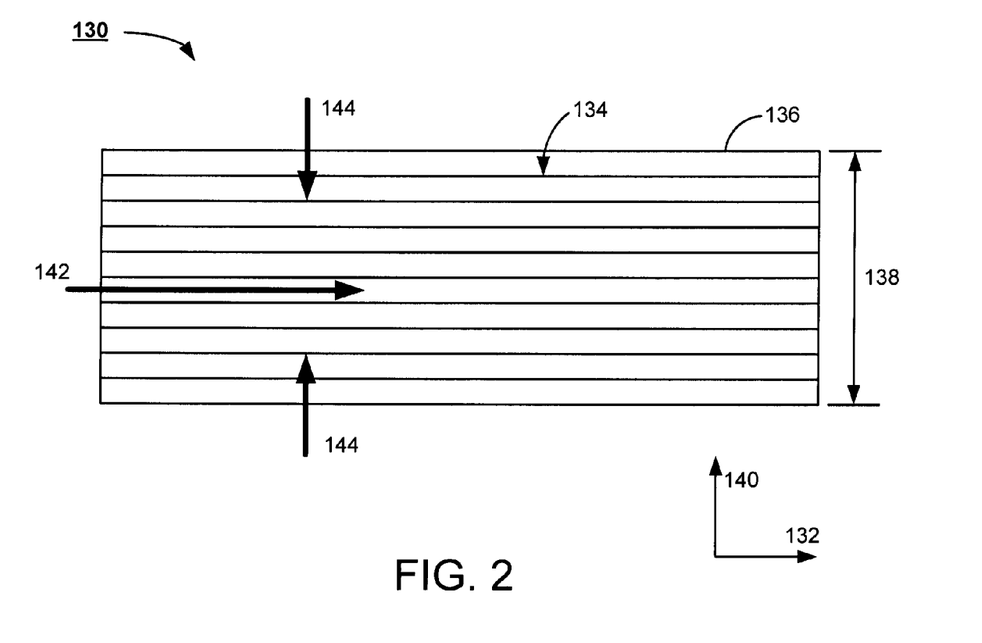
FIG. 2 generally illustrates a magnetic shield capable of deflecting unwanted flux in the data storage device of FIG. 1 in an embodiment.

FIG. 2 displays a block representation of an embodiment of a magnetic shield 130 capable of being used to block the reading of unwanted bits from the media 110 of FIG. 1. The magnetic shield 130 can be made from a variety of materials, such as a Cobalt-Iridium compound like $CoIr_x$ with x being 5% to 50% (atomic percent), that exhibit high anisotropy along a longitudinal plane 132 that runs parallel to the long surface of the rectangular shield 130. As shown, the anisotropy 134 of the shield 130 has high longitudinal magnetic permeability that runs parallel to the plane 132 of the shield 130. Conversely, the anisotropy 134 has low permeability along a transverse plane 138 of the shield 130 that runs parallel to the thickness 138 of the shield 130.

The high degree of anisotropy that corresponds with the longitudinal plane 132 of shield 130 can be characterized as "$-K_u$," which corresponds with negative anisotropy along the transverse axis 140 of the shield 130. The anisotropic characteristics of the shield 130 provide consistent operational behavior in which longitudinal external magnetic fields, such as magnetic flux 142, are easily transmitted through the shield 130 due to the high permeability along the longitudinal plane 132. In effect, the high permeability along longitudinal plane 132 magnifies incident magnetic fields in the plane 132. In contrast, transverse external magnetic fields, such as magnetic flux 144, experience low permeability and thus low magnification due to the negative anisotropy that is aligned along the longitudinal plane 132.

In a non-limiting general comparison, the magnetic shield 130 exhibits structural and operational characteristics that are dissimilar from an isotropic magnetic material. As can be appreciated, a material with isotropic magnetic properties has no directional dependence through the material and magnetism can migrate through the material without experiencing a "hard" or "easy" plane that either facilitates or resists transmission.

While isotropic materials can have a small degree of anisotropy in which one plane is easier for magnetic transmission than another, such material does not have the substantial anisotropic strength of the shield 130 of FIG. 2 which exhibits clear magnetic pathways with anisotropy 134 that define an "easy" and "hard" direction through the shield 130 as corresponding to the longitudinal plane 132 and transverse axis 140, respectively.

The magnetic shield 130 exhibits structural and operational characteristics that are also dissimilar from a uniaxial magnetic material that exhibit an easy axis, which fundamentally differ from the high anisotropic plane of $-Ku$ materials. The magnetic moment of these materials tends to align with the easy axis and induce magnetic instability while not providing the amplitude and P50 gains that are afforded by $-Ku$ materials.

However, the shield 130 is not limited to the anisotropic alignment shown in FIG. 2. The anisotropy 134 can be aligned with the transverse axis 140, longitudinal plane 132, or with any other angular dimension therebetween. Thus, the directional dependence of the shield 130 that corresponds with the high anisotropy can be present in any direction. As such, a "hard" and perpendicular "easy" plane will be present in the shield 130, irrespective of the particular direction of the anisotropy. Accordingly, the shield 130 can be configured in various manners to accommodate a variety of magnetic transmission properties that can provide different operational benefits.

Figure 3:
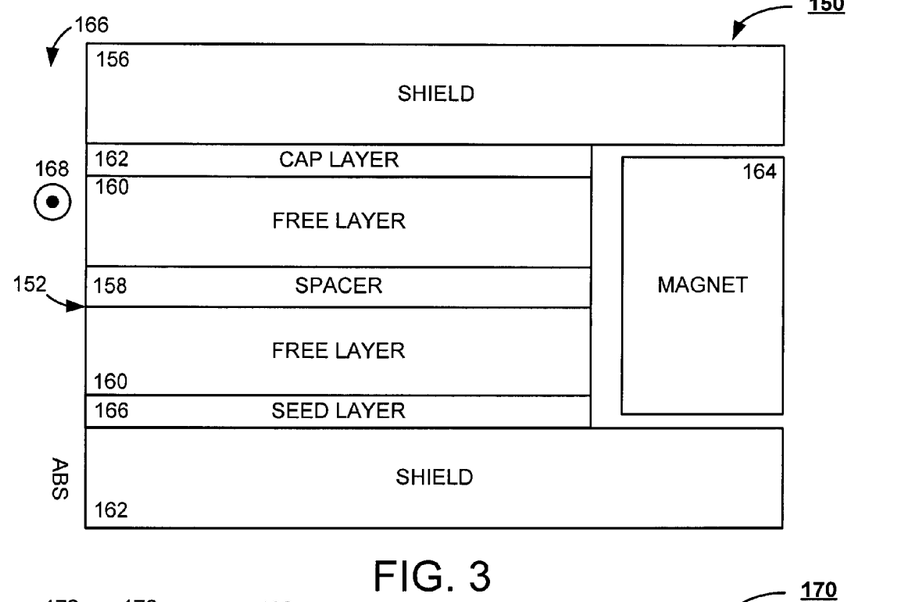
FIG. 3 shows a magnetic element as constructed and operated in accordance with various embodiments of the present invention.

FIG. 3 generally illustrates an embodiment of a magnetic element 150 constructed with a magnetic sensing stack 152 separating first and second magnetic shields 154 and 156. The magnetic stack 152 can be configured with any number of layers and in any orientation that is magnetically responsive, such as the non-magnetic spacer layer 158 disposed between dual free layers 160 that are each attached to electrode layers 162. A permanent magnet 164 can be positioned adjacent the stack 152 opposite from the portion that contacts an air bearing surface (ABS) 166 to impart a magnetic bias force on the free layers 160 without affecting the operational characteristics of the ABS side of the stack 152.

The magnetic element 150 can operate to predominantly sense external magnetic fields presented within the shield-to-shield spacing (SSS) and in a predetermined track width 168 while blocking distally generated magnetic fields from outside of the track with the magnetic shields 154 and 156. As such, the stack 152 mainly "sees" only the magnetic fields within the SSS and predetermined track 168, which is particularly pertinent with the increasing demand for high density data storage devices.

It has been observed that constructing a magnetic element with isotropic magnetic shields, such as Nickel-Iron compounds and Permalloy, can cause the loss of magnetic strength in both the permanent magnet 164 and the free layers 160. Such a loss in magnetic strength can inhibit optimal function of the element 150 due to magnetic stability and sensing margin.

Figure 4:
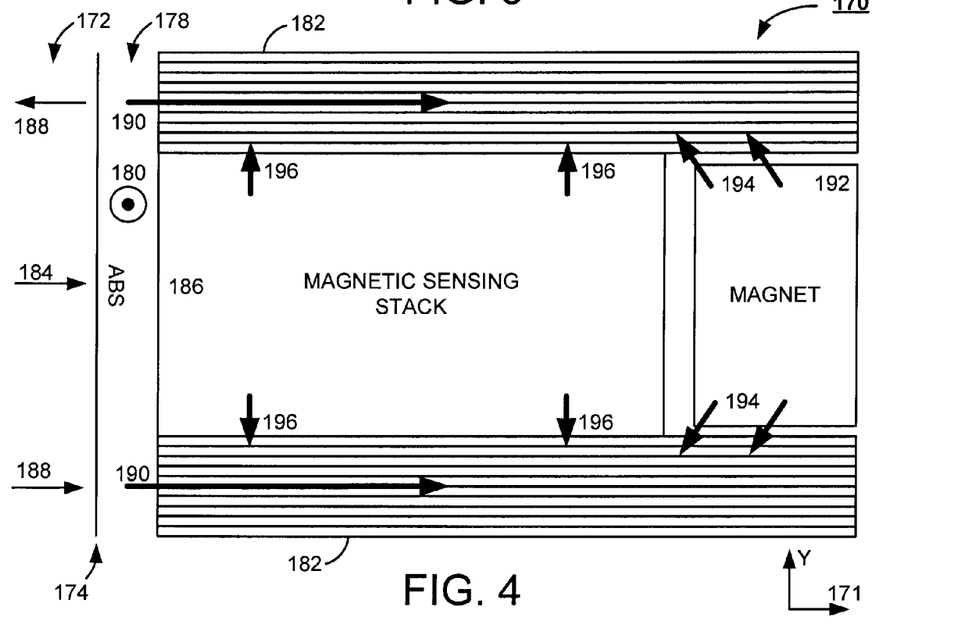
FIG. 4 shows a magnetic element constructed and operated in accordance with various embodiments of the present invention.

Accordingly, the use of a material with high in-plane anisotropy to shield a magnetic element 170, as shown in FIG. 4, can block distally generated magnetic fields while maintaining predetermined operating characteristics. By utilizing a shield with high anisotropy along a longitudinal plane 171 that is parallel to the long side of the magnetic element 170, as discussed above, magnetic bits 172 programmed to a magnetic storage media 174 facing the magnetic stack 176 across the ABS 178 can be efficiently read or blocked depending on the locality in relation to the predetermined track 180.

FIG. 4 generally displays an operation of the magnetic element 170 constructed in accordance with various embodiments with highly anisotropic shields 182. As the element 170 encounters an external bit, such as bit 184, that is within the predetermined track 180, the magnetic stack 186 will sense the magnetic orientation of the bit 184, such as logical state 0 or 1. Concurrently, distal bits 188 encounter the anisotropic shields 182 parallel to its longitudinal plane 171 which allows for the transmission and dissipation of each of the distal bit's magnetizations along the length of the shields 182 without affecting the stack 186. That is, the high magnetic permeability of the shields 182 along the plane that is perpendicular to the surface of the storage media 174 allows for distal magnetic fields 190 outside the track 180 to be easily diverted away from the stack 186.

A magnetic bias force can be continuously applied to the stack 186 from the permanent magnet 192 to create a default magnetization in the stack 186. However, magnetic energy from the magnet 192 can be lost through absorption into isotropic shields. Such loss in the magnetic strength of the magnet 192 can be a detriment to the magnetic stability and operation of the stack 186 due to fluctuating default magnetizations.

Highly anisotropic shields 182 can combat the loss of magnetic energy by deflecting the errant bias flux 194 back towards the stack 186. Thus, the stack 186 is imparted with more magnetic energy that corresponds with a greater bias force and more stable default magnetization.

Absorption of magnetic strength into isotropic shields can similarly plague the magnetic stack 186 with gradual or sudden loss of magnetic energy. The migration of stack flux 196 toward isotropic shields reduces the operational margin that allows for the detection and characterization of the magnetic orientation of a bit. With a highly anisotropic shield, the orientation of the anisotropy along the stripe height (longitudinal plane of the stack) retains magnetization in the stack 186 by repelling stack flux 196. As a result, the magnetization of the stack 186 is maintained and the operational margin consistently and reliably senses programmed bits 184.

Figure 5:
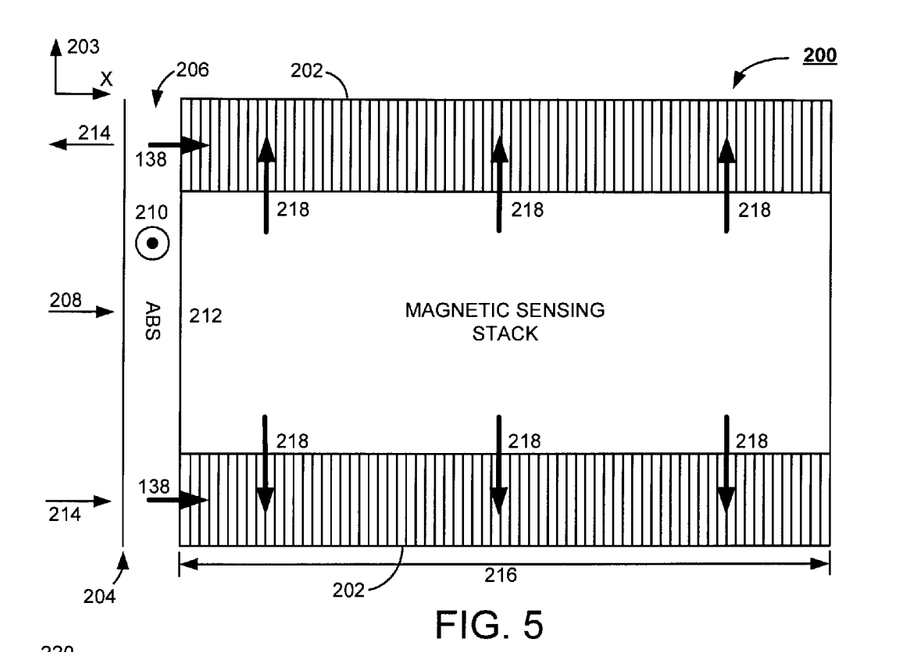
FIG. 5 provides a magnetic element constructed and operated in accordance with various embodiments of the present invention.

An alternative configuration of the anisotropic shields is displayed in the magnetic element 200 of FIG. 5. Each shield 202 has high anisotropy parallel to a transverse (or short) plane 203 of the shield 202 that corresponds with a surface of an external magnetic disk 204 that faces the shields 202 opposite an ABS 206. With the anisotropy of the shields 202 along the transverse plane, the programmed bits 208 in the predetermined track 210 affect the magnetic stack 212 while distal programmed bits 214 are blocked from reaching the stack 212.

In various embodiments, the magnetic stack 212 can have an extended stripe height 216 which stabilizes magnetization without an external bias force, such as permanent magnet 192 of FIG. 4. The extended stripe height 216 of stack 212 can be magnetically stable with reduced migration of stack flux 218 away from the stack 212. Such reduction in stack flux 218 migration allows the anisotropic orientation of the shields 202 to not adversely affect the magnetization or operating margin of the stack 212.

The configuration of the shields can alternatively be constructed with the high anisotropy shield 202 contactingly adjacent to the sensing stack 212 and an isotropic shielding material, such as NiFe, attached to the anisotropic shield 202, but distal to the stack 212. The combination of anisotropic and isotropic shields can provide beneficial shielding and stack operation that may not be possible with the use of the anisotropic shield 202 alone.

Figure 6A:
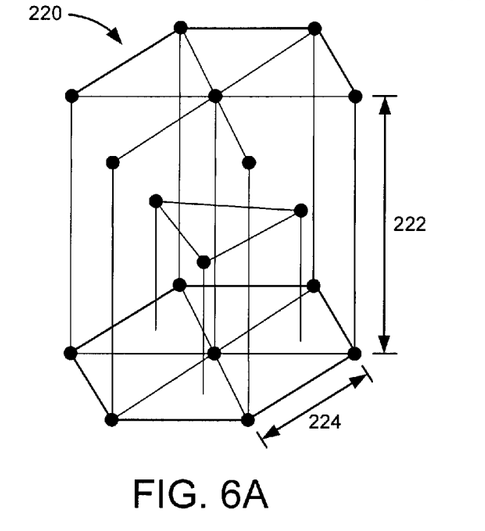
FIGS. 6A and 6B show structural characteristics of a material capable of being used as the magnetic shield in the various embodiments of FIG. 2.
Figure 6B:
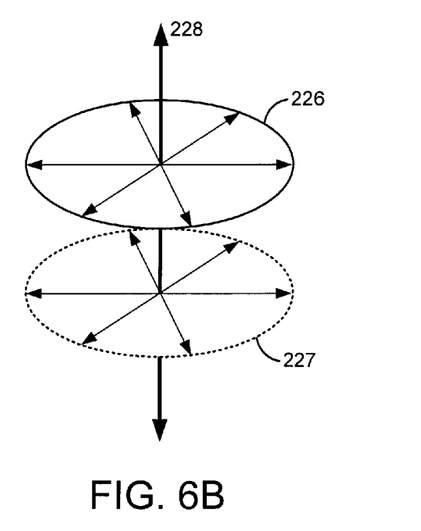

FIGS. 6A and 6B depict structural characteristics of a Cobalt-Iridium compound 220 that can be used in various embodiments of the present invention. As shown in FIG. 6A, a non-limiting point representation of the Cobalt-Iridium compound 220 displays an elongated hexagonal shape. That is, the compound 220 has a length 222 that is greater than any one of the hexagonal sides 224. Such structural configuration of the compound 220 allows for high anisotropy with the creation of easy and hard magnetic planes, as generally displayed in FIG. 6B.

Various non-limiting magnetic characteristics of the compound 220 are shown in FIG. 6B. The elongated structure of the compound 220 corresponds with an easy magnetic plane 226 that have high magnetic permeability, as shown by either plane 226 or 227, positioned anywhere along the axis of rotation 228. Furthermore, the compound 220 has a hard magnetic plane that is perpendicular to the easy plane 226 and parallel to the axis of rotation 228. With such natural formation of easy and hard magnetic planes, a magnetic element can be easily constructed with various layer deposition processes involving the compound 220.

Figure 7:
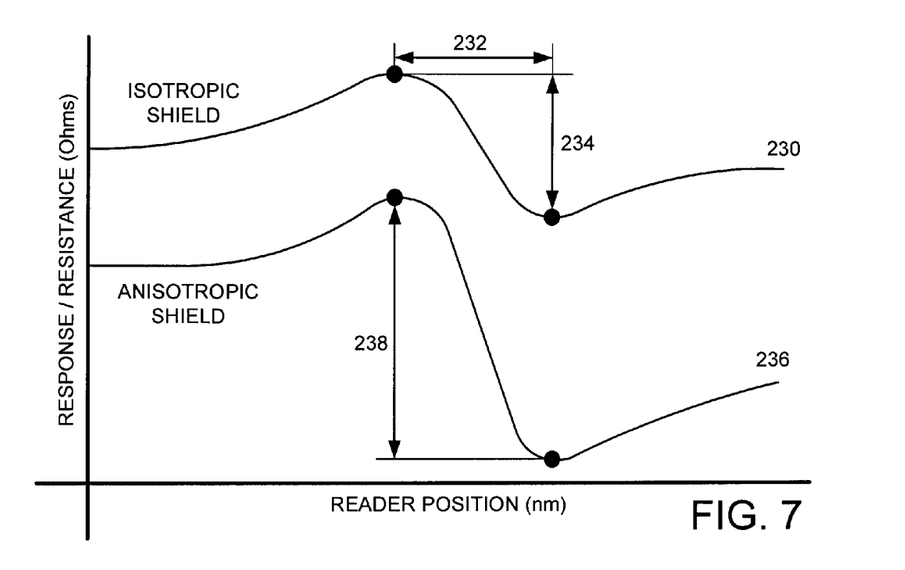
FIG. 7 graphs operational characteristics of an embodiment of the magnetic element of FIG. 4 compared to an isotropic magnetic shield.
Figure 8:
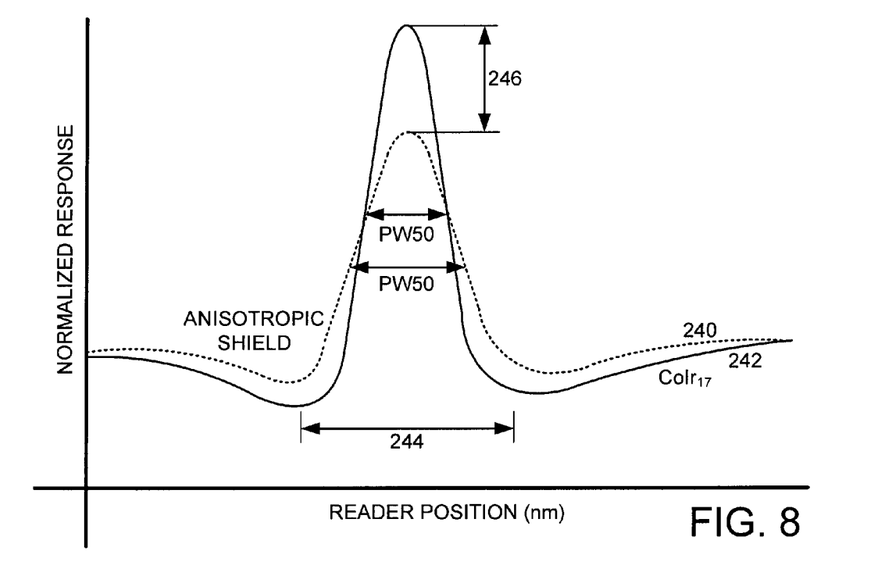
FIG. 8 graphs operational characteristics of an embodiment of the magnetic element of FIG. 4 in comparison to an anisotropic magnetic shield.

FIGS. 7 and 8 each graph operational characteristics of various embodiments of a magnetic element, such as element 170 of FIG. 4. In FIG. 7, shields with anisotropic and isotropic magnetic properties are respectively compared. An isotropic shield, as graphed by line 230, exhibits an elevated response while the magnetic element encounters an externally programmed magnetic bit 232. As the magnetic element passes the magnetic bit 232, a response reduction 234 is experienced which corresponds to a magnetic margin used to detect the magnetic orientation of the bit 232.

In comparison, a magnetic element with an anisotropic shield is graphed by line 236 which shows a greater response reduction 238 in relation to the magnetic element employing an isotropic shield. The large magnetic margin of the anisotropic shielded magnetic element is evidence of the enhanced operating characteristics of anisotropic shields due to increased magnetic stability and flux retention.

FIG. 8 graphs a normalized response for a magnetic element employing an anisotropic shield 240 and a magnetic element with a $CoIr_{17}$ shield 242, in accordance with various embodiments of the present invention. As a magnetic element encounters a programmed bit 244, a pulse is produced with a measurable pulse width. As can be appreciated, the pulse width of a magnetic element at 50% of the pulse amplitude (PW50) is indicative of the operational strength of the element.

As shown, the response to the bit 244 for each shield material is similar, but distinguished by the amplitude and PW50 measurements. For the anisotropic shielded magnetic element 240, a low amplitude and wider PW50 is experienced in relation to the $CoIr_{17}$ shielded element. The difference in amplitude 246 of the shields in combination with a narrower PW50 supports the magnetic stability and enhanced operational characteristics of the CoIr17 shielded element versus an element with anisotropic shields.

The differences between the anisotropic shield 240 and the $CoIr_{17}$ shield 242 illustrate the unique operational benefits of $CoIr_{17}$ over existing anisotropic shields. That is, a magnetically isotropic material can be configured to exhibit a degree of anisotropy, but such configuration will not provide the operational benefits of high amplitude with narrow PW50. In other words, formatting anisotropy in materials lowers pulse amplitude and widens PW50 to the detriment of the element's operational characteristics. In contrast, CoIr17 exhibits high amplitude and narrow PW50 due to natural compound structure that is highly anisotropic.

Figure 9:
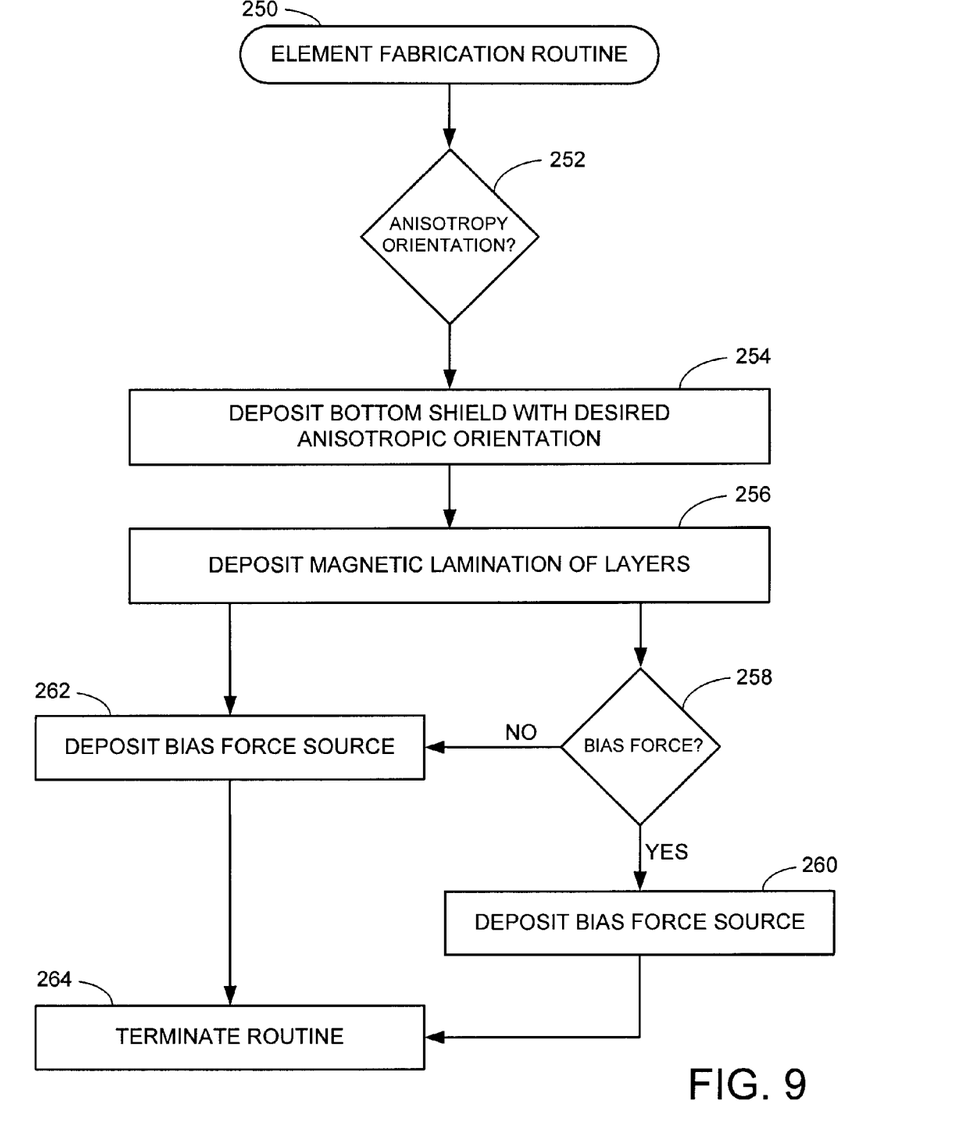
FIG. 9 provides a flowchart of an element fabrication routine carried out in accordance with various embodiments of the present invention.

FIG. 9 provides an embodiment of an element fabrication routine 250 conducted in accordance with various embodiments of the present invention. The routine 250 initially evaluates with decision 252 the anisotropic orientation of the element shields. As discussed above, the highly anisotropic shields can be aligned along the longitudinal or transverse plane of the shield. Determination of the alignment of the anisotropy of the shields progresses to deposition of a Cobalt-Iridium compound bottom shield with a predetermined anisotropic alignment in step 254.

As an example of step 254, $CoIr_{17}$ material that has high anisotropy is continuously deposited on a substrate that is parallel to the predetermined anisotropic orientation. If the predetermined anisotropic orientation is aligned along the transverse plane of the shield, as shown in FIG. 5, successive layers of $CoIr_{17}$ that are the width of the thickness of the shield can be deposited to build up to a predetermined stripe height that defines the length of the shield and element. In contrast, an anisotropic orientation along the longitudinal plane can be constructed with successively deposited layers that are the length of the stripe height of the shield and element to build up to a predetermined thickness of the shield.

With the deposited shield layer, the routine continues to step 256 where a magnetic lamination of layers is successively deposited atop the shield layer. The number, size, and function of the various layers of the magnetic stack are not limited, but are collectively magnetically responsive to external programmed bits. The deposited stack is then evaluated in decision 258 to determine if a magnetic bias force is to set the default magnetization of the stack. If the magnetic stack is designed for a bias force, the routine proceeds to step 260 where a bias force source, such as a permanent magnet is installed behind the stack.

Regardless if a bias force is chosen or not, step 262 deposits a top shield onto the magnetic stack, and possibly the bias force source of step 260. While the top shield has the same anisotropic alignment (transverse or longitudinal) as the bottom shield, such configuration is not required as the top shield anisotropy can differ from the bottom shield. After the deposition of the top shield in step 262, the routine 250 concludes at step 264.

It should be noted that no particular fabrication process is required to deposit the various layers in the routine 250. For example, atomic layer deposition can be used for some layers while vapor layer deposition can be utilized for other layers. The routine 250 is also not limited to the steps and sequence shown in FIG. 9. Various steps can be omitted, moved, or added to the routine 250 in accordance with assorted embodiments of the present invention.

It can be appreciated that the configuration and material characteristics of the magnetic shields described in the present disclosure allows for enhanced magnetic stability while maintaining a small shield-to-shield spacing. The high anisotropy of Cobalt-Iridium compounds allow for the blocking of unwanted magnetic fields and enhancement of magnetizations inside a magnetic element. Moreover, Cobalt-Iridium compounds such as $CoIr_{17}$ provide increased pulse amplitude in combination with narrow PW50. In addition, while the embodiments have been directed to magnetic sensing, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising at least one magnetic shield physically connected to a sensing stack, adjacent a biasing magnet, and constructed of a Cobalt-Iridium compound, the at least one magnetic shield comprising in-plane anisotropy along a longitudinal plane of the sensing stack to deflect bias flux from the biasing magnet to the sensing stack distal an air bearing surface (ABS).

2. The apparatus of claim 1, wherein the Cobalt-Iridium compound is $CoIr_{17}$.

3. The apparatus of claim 1, wherein a first and second magnetic shield are each contactingly adjacent to opposite sides of the sensing stack.

4. The apparatus of claim 3, wherein the biasing magnet comprises a permanent magnet.

5. The apparatus of claim 1, wherein the at least one magnetic shield extends beyond the sensing stack distal the ABS.

6. The apparatus of claim 1, wherein the sensing stack is configured to read magnetic bits a predetermined distance above a recording media on the air bearing surface, the longitudinal plane of the at least one shield being perpendicular to the recording media.

7. The apparatus of claim 6, wherein the in-plane anisotropy of the sensing stack parallel to magnetic bits on the recording media and a stripe height of the sensing stack.

8. The apparatus of claim 6, wherein the in-plane anisotropy of the sensing stack is perpendicular to magnetic bits on the recording media and a stripe height of the sensing stack.

9. The apparatus of claim 1, wherein the shield is less magnetically permeable to flux along a short plane than along a long plane.

10. The apparatus of claim 1, wherein the shield is less magnetically permeable to flux along a long plane than along a short plane.

11. A method comprising constructing at least one magnetic shield physically connected to a sensing stack, adjacent a biasing magnet, and of a Cobalt-Iridium compound, the at least one magnetic shield comprising in-plane anisotropy along a longitudinal plane of the sensing stack to deflect bias flux from the biasing magnet to the sensing stack distal an air bearing surface (ABS).

12. The method of claim 11, wherein the Cobalt-Iridium compound is $CoIr_{17}$.

13. The method of claim 11, wherein the at least one shield maintains a higher PW50 value than an isotropic shield.

14. The method of claim 11, wherein the at least one shield maintains a higher pulse amplitude than an isotropic shield.

15. The method of claim 11, wherein the at least one shield increases a bias force imparted on the sensing stack by the biasing magnet distal the ABS.

16. The method of claim 11, wherein the Cobalt-Iridium compound continuously extends beyond the sensing stack, distal the ABS.

17. An apparatus comprising:
a magnetically responsive sensing stack contactingly between first and second shields, a biasing magnet non-contactingly between the first and second shields, each shield constructed of $CoIr_{17}$ and continuously extending beyond the sensing stack and biasing magnet, distal an air bearing surface (ABS), to deflect bias flux from the biasing magnet to a rear portion of the sensing stack.

18. The apparatus of claim 17, wherein the biasing magnet is separated from the sensing stack and the first and second shields.

19. The apparatus of claim 17, wherein the sensing stack comprises first and second magnetically free layers and lacks any fixed magnetizations.

20. The apparatus of claim 19, wherein the biasing magnet creates a default magnetization in the magnetically free layers.

\* \* \* \* \*

UNITED STATES PATENT AND TRADEMARK OFFICE
CERTIFICATE OF CORRECTION

PATENT NO. : 8,470,463 B2  Page 1 of 1
APPLICATION NO. : 13/092737
DATED : June 25, 2013
INVENTOR(S) : James Gary Wessel et al.

It is certified that error appears in the above-identified patent and that said Letters Patent is hereby corrected as shown below:

In the Claims

In Col. 7, line 14
replace "stack parallel"
with "stack is parallel"

Signed and Sealed this
Tenth Day of September, 2013

Teresa Stanek Rea
*Acting Director of the United States Patent and Trademark Office*